United States Patent [19]
Kaeriyama et al.

[11] Patent Number: 5,872,046
[45] Date of Patent: Feb. 16, 1999

[54] METHOD OF CLEANING WAFER AFTER PARTIAL SAW

[75] Inventors: Toshiyuki Kaeriyama; Takeshi Harada, both of Ibaraki-Ken, Japan

[73] Assignee: Texas Instruments Incorporated, Dallas, Tex.

[21] Appl. No.: 833,165

[22] Filed: Apr. 3, 1997

Related U.S. Application Data

[60] Provisional application No. 60/015,107 Apr. 10, 1996.

[51] Int. Cl.$^6$ .................................................. H01L 21/44
[52] U.S. Cl. ............................................ 438/465; 439/460
[58] Field of Search .................................... 438/460, 461, 438/462, 463, 464, 465

[56] References Cited

U.S. PATENT DOCUMENTS

| | | | |
|---|---|---|---|
| 4,033,027 | 7/1977 | Fair et al. | 29/583 |
| 4,729,971 | 3/1988 | Coleman | 438/464 |
| 5,061,049 | 10/1991 | Hornbeck | 359/224 |
| 5,079,544 | 1/1992 | DeMond et al. | 340/701 |
| 5,105,369 | 4/1992 | Nelson | 364/525 |
| 5,179,035 | 1/1993 | Shannon | 438/464 |
| 5,185,295 | 2/1993 | Goto et al. | 437/226 |
| 5,278,652 | 1/1994 | Urbanus et al. | 358/160 |
| 5,389,182 | 2/1995 | Mignardi | 156/344 |
| 5,393,706 | 2/1995 | Mignardi et al. | 437/226 |
| 5,435,876 | 7/1995 | Alfaro et al. | 156/247 |
| 5,445,559 | 8/1995 | Gale et al. | 451/388 |
| 5,527,744 | 6/1996 | Mignardi et al. | 437/226 |
| 5,597,767 | 1/1997 | Mignardi et al. | 437/227 |

*Primary Examiner*—Kevin Picardat
*Attorney, Agent, or Firm*—Julie L. Reed; Richard L. Donaldson

[57] ABSTRACT

A process of cleaning debris (24) from a partially-sawn semiconductor wafer (10). The method of the present invention includes cleaning a partially fabricated wafer (12) that may have fabricated on it a micromechanical device (16) which can be easily damaged by particles (24) generated by the partial-saw process, such as oxide particles. The present invention includes cleaning the partially-sawn wafer with a solution including diluted hydrofluoric acid and an alkyl glycol. Clean-up using this solution accomplishes two goals. First, it removes debris including oxide particles on the wafer surface and in the kerfs (22), and second, reduces the depth of damage in the surface (26) of a CMOS layer (14) proximate the kerf (22) which has been determined to be a source of particles generated after a wafer cleanup process. A subsequent megasonic process is utilized to acoustically vibrate the wafer while bathed in deionized water to further remove any other particles. After the clean-up process of the present invention, the semiconductor wafer is completed by performing at least one more semiconductor process. An substantially improved yield is realized by utilizing the cleaning process of the present invention.

16 Claims, 1 Drawing Sheet

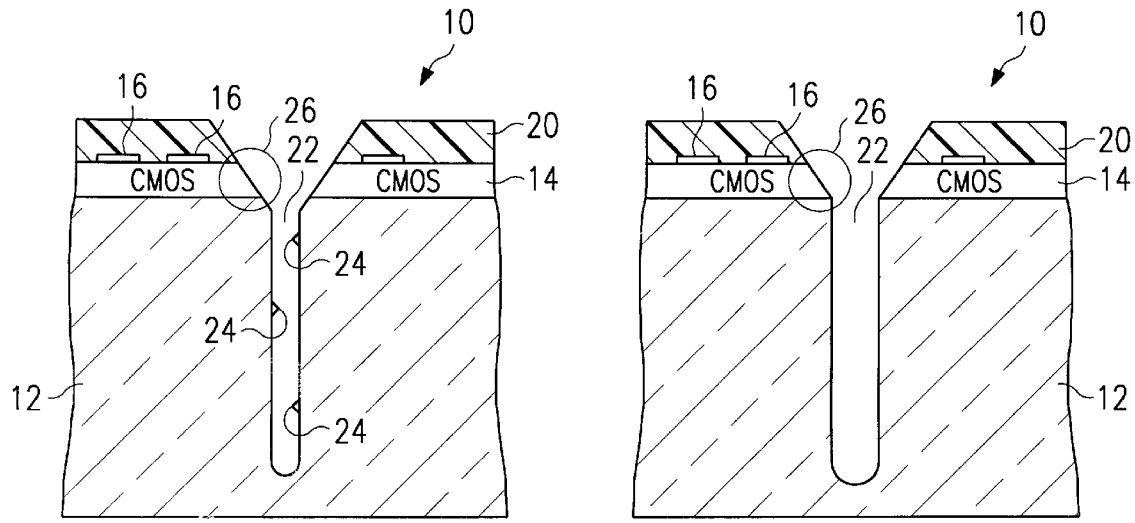
FIG. 1
FIG. 2
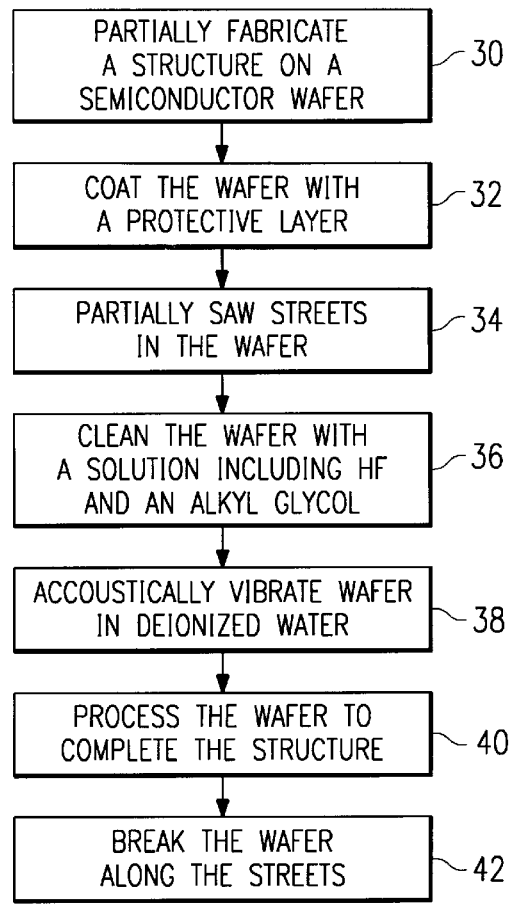
FIG. 3

METHOD OF CLEANING WAFER AFTER PARTIAL SAW

This application claims priority under 35 USC § 119 (e)(1) of provisional application number 60/015,107, filed Apr. 10, 1996.

CROSS REFERENCE TO RELATED APPLICATIONS

Cross reference is made to commonly assigned patent application Ser. No. 08/369,838 filed Jan. 6, 1995, entitled "Separation of Wafer Into Die with Wafer-Level Processing" the teachings incorporated herein by reference.

FIELD OF THE INVENTION

This invention relates generally to a method of manufacturing semiconductor dies from wafers, such as those used for integrated circuits, and more particularly to a method of cleaning a partially processed wafer after a partial saw process, and before subsequent processing procedures.

BACKGROUND OF THE INVENTION

Conventional manufacturing techniques mass produce integrated circuit dies from wafers, typically silicon wafers. Each wafer is processed by subjecting the wafer to a series of processes including material deposition and etching procedures to create several integrated circuit dies on the wafer. The wafer is then partitioned and separated along streets to create individual die, typically through a sawing process. These dies are then bonded to leads, and finally packaged in a ceramic or plastic housing to form the final integrated circuit.

In the case of manufacturing micromechanical devices, as well as other devices such as biological or chemical sensors, it is desired to further process the semiconductor wafer after a "partial saw" process, that is, before the wafer is completely diced or cut to form each of the individual die. The partial-saw process is beneficial to initially and accurately cut the wafer along the streets while the wafer is easily registerable with processing equipment, and before the circuit is complete. However, this partial-saw process undesirably generates particles which can contaminate, damage, and possibly render useless, the individual dies if not carefully controlled. Micromechanical devices generally include miniature devices manufactured upon a substrate and have moving parts. Some examples include microaccelerometers, micromotors and gears. These micromechanical devices are particularly vulnerable to particles, and thus the partial-saw process is useful to achieve a partial cut before the moving parts are defined. Clean-up to remove residual debris and particles after the partial-saw process is critical.

A recent innovation of Texas Instruments Incorporated of Dallas Texas, is the digital micromirror device or the deformable mirror device (collectively DMD). The DMD is an electro/mechanical/optical Spatial light modulator (SLM) suitable for use in displays, projectors and hard copy printers. The DMD is a monolithic single-chip integrated circuit SLM, comprised of a high density array of 16 micron square movable micromirrors on 17 micron centers. These mirrors are fabricated and supported over address circuitry including an array of SRAM cells and address electrodes. Each mirror forms one pixel of the DMD array and is bistable, that is to say, stable in one of two positions, wherein a source of light directed upon the mirror array will be reflected in one of two directions. In one stable "on" mirror position, incident light to that mirror will be reflected to a projector lens and focused on a display screen or a photosensitive element of a printer. In the other "off" mirror position, light directed on the mirror will be deflected to a light absorber. Each mirror of the array is individually controlled to either direct incident light into the projector lens, or to the light absorber. The projector lens ultimately focuses and magnifies the modulated light from the pixel mirror array onto a display screen and produce an image in the case of a display. If each pixel mirror of the DMD array is in the "on" position, the displayed image will be an array of bright pixels.

For a more detailed discussion of the DMD device and uses, cross reference is made to U.S. Pat. No. 5,061,049 to Hornbeck, entitled "Spatial Light Modulator and Method"; U.S. Pat. No. 5,079,544 to DeMond, et al, entitled "Standard Independent Digitized Video System"; and U.S. Pat. No. 5,105,369 to Nelson, entitled "Printing System Exposure Module Alignment Method and Apparatus of Manufacture", each patent being assigned to the same assignee of the present invention and the teachings of each are incorporated herein by reference. Gray scale of the pixels forming the image is achieved by pulse-width modulation techniques of the mirrors, such as that described in U.S. Pat. No. 5,278,652, entitled "DMD Architecture and Timing for Use in a Pulse-Width Modulated Display System", assigned to the same assignee of the present invention, and the teachings of which are incorporated herein by reference.

The individual mirrors of the DMD mirror array are easily susceptible to damage from debris including particles generated during the wafer saw and/or break process. Because the DMD is a micromechanical device with movable pixel mirrors, the DMDs fabricated upon a wafer may not be conveniently covered with a protective oxide coating prior to a final saw process as is conventional with other semiconductor processing techniques. Moreover, due to the conductive address electrodes with are positioned below the conductive mirrors, a conductive particle entrapped between the mirror and address electrode could easily short the mirror to the address electrode. Thus, it is particularly important in the case of the DMD to avoid leaving behind any particles during the wafer saw process and clean process.

As disclosed in commonly assigned U.S. Pat. No. 5,435,876 entitled Grid Array Masking Tape Process, one technique to protect the wafer during sawing is to utilize a grid array masking tape over the active surface of the processed wafer. The tape adheres to the wafer along a grid extending between the formed integrated circuits and prevents debris from damaging the active surface during the sawing process. The tape is removed after the saw process and then the photoresist under the mirror layer is undercut by a plasma etch process to form wells under the mirrors, allowing the mirrors to deflect.

Other techniques for processing a wafer to form micromechanical devices are disclosed in commonly assigned U.S. Pat. No. 5,393,706 entitled "Integrated Partial Sawing Process", U.S. Pat. No. 5,445,559, entitled "Wafer-Like Processing after Sawing DMDs", U.S. Pat. No. 5,435,876 entitled "Grid Array Masking Tape Process", and U.S. Pat. No. 5,389,182, entitled "Use of a Saw Frame with Tape as a Substrate Carrier for Wafer Level Backend Processing". The teaching of each of these commonly assigned patents is incorporated herein by reference.

In commonly assigned U.S. patent application Ser. No. 08/369,838 entitled "Separation of Wafer into Die with Wafer-Level Processing", there is disclosed a method of covering the surface of a wafer with a protective coating, whereby separation lines are then inscribed on the top surface of the wafer. These separation lines represent boundaries between die and have a predetermined depth. After the protective coating is removed, the wafer is further processed with at least one more wafer-level process. Finally, the wafer is separated into die along the separation lines. In this patent application, there is taught a method whereby the protective coating maybe accomplished by first spinning-on a layer of photoresist and then depositing a thin oxide layer. This protective layer is later removed during the cleaning step using solvents, solvent streams, or ashing. In addition, a wet etch process can be used to remove a resist material.

One technical challenge encountered during the processing of the DMD is the fact that the micromechanical mirrors and associated support structure are fabricated upon CMOS addressing circuitry. Thus, when the wafer is partially sawn along the streets to form kerfs, oxide particles from the CMOS layer of the wafer are generated, and may become disposed within the kerfs. These oxide particles can also be scattered about and disposed upon the protective layer, as shown in FIG. 1.

Although there are several techniques available for removing this debris including oxide particles, it has now recently been discovered that even after a cleanup process to remove oxide particles from the wafer surface and kerfs, the edges of the buried CMOS layer adjacent the kerfs will continue to generate oxide particles over time, after a clean-up process. It has now been discovered that the subsequent generation of these oxide particles from the CMOS layer is due to the microscopic damage, including cracks, in the CMOS layer walls adjacent these kerfs. Time, vibration and other factors facilitate the continuous release of these microscopic oxide particles from the CMOS layer adjacent the kerfs.

It is an object of the present invention to provide a method of cleaning a semiconductor wafer after a partial saw process, and before subsequent processing, which also substantially reduces or eliminates the subsequent generation of debris, including oxide particles from the CMOS layer, after the post-saw cleanup process. Such a method of reducing the subsequent generation of oxide particles should realize substantially higher yield of dies, especially those of the micromechanical type including DMD's, but also other integrated circuits and devices that require subsequent processing including chemical or biological sensors.

SUMMARY OF THE INVENTION

The present invention achieves technical advantages as a method of cleaning a semiconductor wafer after a partial-saw process with a solution containing diluted hydrofluoric acid (HF) and an alkyl glycol. Preferably, this solution includes a portion of deionized water as well. By using hydrofluoric acid in combination with the alkyl glycol, various debris including oxide particles from a CMOS layer are adequately cleansed away from the semiconductor wafer surface and kerfs, and additional particle generation is inhibited. The alkyl glycol protects the partially processed semiconductor wafer from damage, which would otherwise be incurred by a simple hydrofluoric acid solution. The preferred embodiment of the present invention is well suited for fabricating a micromechanical device. A partially processed semiconductor wafer is first coated with a protective layer, preferably a photoresist. After a partial-saw process, the debris is adequately removed from the partially processed wafer by cleansing the wafer with the alkyl glycol and HF solution. The solution of the present invention will not penetrate or diffuse through the photoresist layer. Thus, by employing an alkyl glycol with hydrofluoric acid, the hydrofluoric acid can now be effectively used without damaging the delicate structures of the wafer, such as the structure of the micromechanical device.

To further facilitate cleanup, the semiconductor wafer is also subjected to a megasonic process. The partially processed semiconductor wafer is acoustically vibrated while the wafer is immersed in a solution of deionized water, preferably including 3% hydrogen peroxide. Thereafter, the wafer may be dried with minimal mechanical damage or heat stress by blow drying the wafer with nitrogen.

Where the use of diluted hydrofluoric acid for wafer clean-up was prohibited in the past due to the wafer damage it would produce, the method of present invention permits the successful use of hydrofluoric acid when combined with an alkyl glycol to inhibit the penetration of the hydrofluoric acid through the protective layer. In the preferred embodiment of the present invention, the alkyl glycol comprises either of glycerine, propylene glycol, ethylene glycol or butylene glycol. Preferably, ethylene glycol is utilized. The solution preferably has at least 50% by volume alkyl glycol, with the preferred solution being 8 parts alkyl glycol to 1 part diluted hydrofluoric acid to 1 part deionized water (8-1-1). The hydrofluoric acid is preferably buffered, with the 1 part hydrofluoric acid having a concentration of about 0.5%.

BRIEF DESCRIPTION OF THE DRAWINGS

FIG. 1 is a sectional side view of a partially processed semiconductor wafer illustrating structural components of a partially fabricated micromechanical device defined over a layer of CMOS circuitry, the micromechanical structure being covered with a protective layer of photoresist, and further illustrating debris including oxide particles present in a saw kerf after a partial-saw process;

FIG. 2 is a sectional side view of the partially processed semiconductor wafer after the cleaning process of the present invention, whereby the debris, including oxide particles, has been removed from the wafer surface and kerf by utilizing a solution of hydrofluoric acid with an alkyl glycol, without damaging the micromechanical structure of the partially completed die; and FIG. 3 is a flow diagram of the present invention illustrating the sequential steps performed to process a partially fabricated semiconductor wafer without damage thereto.

DETAILED DESCRIPTION OF THE PREFERRED EMBODIMENT

Referring now to FIG. 1, there is generally shown at 10 a sectional side view of a partially processed semiconductor wafer, which may comprise of silicon or other material. For purposes of illustration and clarity, the method of the present invention will be discussed with reference to cleaning a partially processed wafer having a partially fabricated micromechanical device, specifically, that of the DMD-type manufactured by Texas Instruments of Dallas Tex., the DMD device having been discussed earlier in the section entitled Background of the Invention and discussed in the various commonly assigned patents.

Still referring to FIG. 1, a silicon wafer substrate 12 is seen to have fabricated on the surface thereof a layer of CMOS addressing circuitry 14. Fabricated upon this CMOS addressing circuitry layer 14 is a plurality of micromirrors and associated hinge and support structure generally shown at 16. For more detailed discussion of this DMD microstructure 16, reference is made to the various commonly assigned patents discussed in the Background of the Invention. Basically, this structure 16 includes tiny micromirrors which will ultimately be suspended by torsion hinges from a pair of support posts, over the addressing circuitry of the CMOS layer 14. CMOS layer 14 includes address electrodes and associated memory cells, whereby the one electrode is addressed to create electrostatic attraction with the associated overlying mirror to cause the mirror to tilt one of two directions.

A layer of photoresist 20, such as that comprised of an 8000 Angstrom-thick layer of Microelectronics PFR1X710-D75, is conventionally deposited over the partially processed micromechanical structures 16, as shown. At the process stage shown in FIG. 1, the wafer substrate 12 has been partially sawn along streets to form kerfs 22. The wafer 10 will later be separated along these kerfs 22 during a wafer-break process to form individual die. As illustrated during the partial-saw process, debris will be formed, including oxide particles shown at 24 which become deposited upon the semiconductor wafer surface, and in the deep areas of kerfs 22. These oxide particles 24 are typically formed by sawing into the CMOS layer 14.

It has now been recognized that even after the partial saw process, subsequent debris is still subsequently created by the edges of the CMOS layer 14 proximate the kerf 22, illustrated at region 26. This region 26 of the CMOS layer continues to generate oxide particles 24 due to the induced microscopic damage including cracks developed proximate the cut surface of the CMOS layer 14 during the saw process. The present invention recognizes that even after a conventional cleanup process, oxide particles can continue to be generated by the CMOS layer 14 proximate kerf 22 to contaminate the partially processed wafer 10 if not otherside treated.

Referring now to FIG. 2, there is shown a sectional side view of the partially processed semiconductor wafer 10 after the cleaning process of the present invention which will be described shortly. As illustrated, a substantial amount of debris particles, including oxide particles, are removed from both the surface of the semiconductor wafer 10, and from the deeper portions of the kerfs 22. Moreover, there is no damage incurred by the micromechanical structure 16 which is still coated by the resist layer 20. Referring again to region 26, this surface of the CMOS layer 14 proximate the kerf 22 has been treated such that fewer subsequent oxide particles will be generated. This is due to the fact that this surface region 26 has been treated to substantially compensate for the damage to this surface during the partial saw process.

Referring now to FIG. 3, there is shown a clean-up process according to the preferred embodiment of the present invention to one, remove the debris 24 including the oxide particles, and two, treat the region 26 of the CMOS layer proximate kerf 22 to prevent the further generation of debris post cleanup.

At step 30, a semiconductor wafer is partially fabricated to include sensitive structure such as microstructure 16 shown in FIG. 1. Again, for purposes of illustration, this sensitive structure 16 is depicted as micromirrors, but could comprise of other micromechanical devices suitable for accelerometers, micromotors, or for use in biological or chemical sensors. For purposes of the present invention and without limitation thereto, structure 16 is intended to include and encompass any structure which can be embodied in an electronic integrated circuit and which could become damaged or disabled by debris formed during the partial saw process.

At step 32, the partially processed wafer is coated with a protective layer of photoresist, shown as layer 20 in FIGS. 1 and 2. Preferably, this photoresist is comprised of PFR1X710-D75 material, and has a thickness of about 8000+/−50 Angstroms. As an alternative, a 200 Angstrom oxide/photoresist protective layer could be utilized.

At step 34, the partially processed wafer is partially sawn along the streets to form kerfs 22 in the partially processed wafer. These kerfs 22 extend inbetween the individual circuits, and form the point of breakage when the wafer is partitioned to form individual dies.

At step 36, the partially processed wafer 10 is now cleaned with a solution according to the preferred embodiment of the present invention. This solution is comprised of diluted hydrofluoric acid (HF), and a portion of an alkyl glycol. Preferably, the solution also includes deionized water, with a preferred ratio of these elements being 8 parts of an alkyl glycol, 1 part hydrofluoric acid, and 1 part deionized (8-1-1). Preferably, the hydrofluoric acid is a buffered diluted acid having about 0.5% concentration. The alkyl glycol is chosen from the group including, but not limited to, glycerine, propylene glycol, ethylene glycol and butylene glycol. Preferably, ethylene glycol is the preferred solution of the preferred embodiment of the present invention because of its HF penetration-inhibiting quality and compatibility with HF.

During the cleaning process of step 36, the partially processed wafer 10 is bathed in the 8-1-1 solution for about 6 minutes. During this period, the solution etches away approximately 600 Angstroms of the surface of the CMOS layer 16 at region 26. The removal of this 600 Angstroms at region 16 removes the damaged portion of the CMOS layer 14 which has been discovered to subsequently generate oxide particles 24. By removing some of the damaged portion of the CMOS surface at region 26, the surface that remains after clean-up has no easily-dislodgable particles and thus the risk of particles being subsequently generated is substantially reduced.

At step 38, the partially processed wafer 10 is then immersed in a solution of deionized water, preferably having 3% hydrogen peroxide to maintain purity of the deionized water. While immersed in this deionized water, the wafer is subjected to a megasonic process at 1 megahertz. This process acoustically induces vibration in the wafer to further remove any other particle that remains in the kerf 22 or on the surface of the wafer after step 36. Thereafter, the fragile wafer 10 is dried by blow drying nitrogen across the wafer at room temperature with DRW equipment, which minimizes the mechanical damage or heat stress that could otherwise be generated.

At step 40, the wafer 10 is then further processed by performing at least one more semiconductor process, which ultimately includes the removal of the resist layer 20. When this resist layer 20 is removed, the micromirrors are freely suspended over the address electrodes, and importantly, there will be no remaining particles to damage or inhibit the micromirrors from their normal tilting operation.

At step 42, the wafer is broken along the streets to form the individual dies. This break process may include pressing a domed surface on the back or underside of the wafer, causing the wafer dies to separate along kerfs 22. The wafer may be positioned upsidedown over an adhesive tape, whereby any particles generated during this final break process fall downwardly and attach to the adhesive strip.

In summary, the process of the present invention includes cleanup of a partially processed wafer after a partial-saw process, prior to subsequent processing steps. The present invention employs hydrofluoric acid in combination with an alkyl glycol. This combination utilizes the advantages of hydrofluoric acid as a cleaning solution, whereby the alkyl glycol inhibits the penetration or diffusion of the dilute hydrofluoric acid through the protective layer which may comprise of photoresist. Thus, hydrofluoric is utilized whereby damage to underlying structures of a device such as a micromechanical device or other damageable structure, is reduced in probability. It is theorized that the alkyl glycol interacts with the photoresist to form a residue, and which inhibits the migration of the hydrofluoric acid through the protective resist layer.

The method of the present invention achieves two goals. First, it removes particles which remain after a partial-saw process, including oxide particles from the CMOS layer formed upon the wafer. Second, it partly removes the damaged surface of the CMOS layer proximate the kerf layer, which has been determined to be a source of particles being subsequently generated, even after a cleanup process. By removing approximately 600 Angstroms of this CMOS layer proximate the kerf, the damaged portion of the CMOS layer is reduced. The present invention substantially increases the yield of devices from wafers.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance, the present invention is applicable to processing partially fabricated structures including micromechanical devices including spatial light modulators of the DMD type, accelerometers, micromotors, chemical and biological sensors.

We claim:

1. A process for cleaning a semiconductor wafer having partially completed structures, comprising the steps of:
   a) coating said semiconductor wafer with a protective layer;
   b) partially sawing streets in said wafer;
   c) applying a solution to said wafer including diluted hydrofluoric acid and an alkyl glycol;
   d) processing said wafer to complete said structures; and
   e) breaking said wafer along said partially sawn streets into individual chips.

2. The process as specified in claim 1 further comprising the step of including deionized water in said solution.

3. The process as specified in claim 1 wherein said solution comprises more than 50 percent of said alkyl glycol by volume.

4. The process as specified in claim 1 wherein said solution is approximately 8 parts said alkyl glycol to 1 part diluted hydrofluoric acid to 1 part deionized water.

5. The process as specified in claim 1 wherein said alkyl glycol comprises either of glycerine, propylene glycol, ethylene glycol or butylene glycol.

6. The process as specified in claim 1 wherein said hydrofluoric acid is buffered.

7. The process as specified in claim 4 wherein said hydrofluoric acid is about 0.5% concentration.

8. The process as specified in claim 1 further comprising the step of acoustically vibrating said solution before performing said step d).

9. The process as specified in claim 1 comprising the step of bathing said wafer in said solution in said step c) to clean said wafer.

10. The process as specified in claim 4 comprising the step of bathing said wafer in said solution to remove approximately 600 Angstroms of said protective layer proximate said streets.

11. The process as specified in claim 1 wherein said wafer has a layer of oxide disposed beneath said protective layer, said layer being sawn into during said step b).

12. The process as specified in claim 1 wherein said wafer comprises a partially fabricated micromechanical device.

13. The process as specified in claim 1 wherein said protective layer comprises photoresist.

14. The process as specified in claim 1 wherein said protective layer comprises of oxide/photoresist.

15. The process as specified in claim 1 further comprising the step of drying said wafer after step c).

16. The process as specified in claim 15, comprising the step of drying said wafer by blowing nitrogen gas across said wafer.

* * * * *